(12) United States Patent
Huang et al.

(10) Patent No.: US 12,349,524 B2
(45) Date of Patent: Jul. 1, 2025

(54) SEMICONDUCTOR LIGHT SOURCE DEVICE OF OPTICAL INTEGRATED PACKAGING

(71) Applicant: Shenzhen Raysees AI Technology Co., Ltd., Shenzhen (CN)

(72) Inventors: Wei Huang, Shenzhen (CN); Yuxing Cao, Shenzhen (CN); Yang Wang, Dublin, CA (US)

(*) Notice: Subject to any disclaimer, the term of this patent is extended or adjusted under 35 U.S.C. 154(b) by 70 days.

(21) Appl. No.: 17/336,414

(22) Filed: Jun. 2, 2021

(65) Prior Publication Data

US 2021/0384390 A1    Dec. 9, 2021

(30) Foreign Application Priority Data

Jun. 4, 2020    (CN) .......................... 202010502212.5

(51) Int. Cl.
*H10H 20/855*    (2025.01)
*H10H 20/80*    (2025.01)
(Continued)

(52) U.S. Cl.
CPC ...... *H10H 20/855* (2025.01); *H10H 20/8514* (2025.01); *H10H 20/853* (2025.01); *H10H 20/857* (2025.01); *H10H 20/882* (2025.01)

(58) Field of Classification Search
CPC ....... H01L 33/62; H01L 33/58; H01L 33/486; H01L 33/505; H01L 33/50; H10H 20/855;
(Continued)

(56) References Cited

U.S. PATENT DOCUMENTS

| 2006/0034082 A1 | 2/2006 | Park et al. | |
| 2012/0126144 A1* | 5/2012 | Lee ........................ | H01L 33/505 |
| | | | 250/462.1 |

(Continued)

FOREIGN PATENT DOCUMENTS

| CN | 201122607 Y | 9/2008 |
| CN | 202487662 U | 10/2012 |

(Continued)

OTHER PUBLICATIONS

English translation of office action issued in a Chinese counterpart (Chinese application No. 202010502212.5).

*Primary Examiner* — Antonio B Crite
(74) *Attorney, Agent, or Firm* — Jigang Jin

(57) ABSTRACT

The present application relates to the technical field of optical integrated devices, and specifically discloses a semiconductor light source device of optical integrated packaging with high light extraction efficiency and low device heat generation. The semiconductor light source device of optical integrated packaging comprises a substrate, an optical lens, a LED chip and a light transmitting glue layer, the substrate is provided with a circuit, and the optical lens is fixedly connected with the substrate; a light source cavity is provided between the optical lens and the substrate; the LED chip and the light transmitting glue layer are respectively accommodated in the light source cavity; the LED chip is arranged on top of the circuit and electrically connected with the circuit; the light transmitting glue layer is at least arranged on an upper surface of the LED chip; the light transmitting glue layer is used to reduce Fresnel loss when the light of the LED chip is taken out; an outer surface of the light transmitting glue layer is a convex surface, and the convex surface is used to reduce a total reflection loss of a light emitted by the LED chip.

5 Claims, 1 Drawing Sheet

(51) Int. Cl.
*H10H 20/851* (2025.01)
*H10H 20/853* (2025.01)
*H10H 20/857* (2025.01)
*H10H 20/858* (2025.01)
*H10H 20/01* (2025.01)

(58) Field of Classification Search
CPC ............. H10H 20/8506; H10H 29/851; H10H 29/8512; H10H 29/8513; H10H 29/8516
See application file for complete search history.

(56) References Cited

U.S. PATENT DOCUMENTS

| | | | | |
|---|---|---|---|---|
| 2013/0322068 | A1* | 12/2013 | Clark | H01S 5/0231 362/249.02 |
| 2016/0190405 | A1* | 6/2016 | Yamada | H01L 33/54 257/98 |
| 2018/0248082 | A1* | 8/2018 | Hsieh | H01L 33/486 |
| 2018/0323354 | A1* | 11/2018 | Wang | H01L 33/58 |
| 2021/0328120 | A1* | 10/2021 | Kuo | H01L 33/0093 |

FOREIGN PATENT DOCUMENTS

| | | | | | |
|---|---|---|---|---|---|
| CN | 212625634 | U | | 2/2021 | |
| CN | 113270437 | A | * | 8/2021 | ....... G02F 1/133603 |
| CN | 113540329 | A | * | 10/2021 | ........... H01L 33/005 |

* cited by examiner

SEMICONDUCTOR LIGHT SOURCE DEVICE OF OPTICAL INTEGRATED PACKAGING

FIELD OF THE INVENTION

The present application relates to the technical field of optical integrated devices, and in particular to an semiconductor light source device of optical integrated packaging.

BACKGROUND OF THE INVENTION

LED is a lighting device with many advantages, such as small volume, low power consumption, high brightness, environmental protection, durability and long service life. In order to improve the quality of the light spot and make the products light and small, some packaging factories have combined the secondary lens with the LED chip. Specifically, a small optical lens is designed on the top of the LED chip to adjust the shape of the light spot produced by the LED chip and improve the quality of the light spot. In other words, the function of the lens is integrated into the LED chip to complete the chip level optical lens design.

However, in the traditional optical lens light source devices, the Fresnel loss of the light is large after the light emitted by LED chip passes through the air interface with a refractive index of 1, and the light extraction efficiency of the LED chip is only about 70%, which causes a great waste of the light energy. In addition, the light energy of the parts that is not taken out of the optical lens will be converted into heat energy, which makes the temperature of each device increase, and the device will be in the overheating condition for a long time, which will easily accelerate the aging of the device, thus shortening the service life of the device.

SUMMARY OF THE INVENTION

Based on this, it is necessary to provide an semiconductor light source device of optical integrated packaging with a high light extraction efficiency and a low heat generation, aiming at the technical problems of the low light extraction efficiency and the accelerated aging due to the overheat.

An semiconductor light source device of optical integrated packaging, comprises a substrate, an optical lens, a LED chip and a light transmitting glue layer, the substrate is provided with a circuit, and the optical lens is fixedly connected with the substrate; a light source cavity is provided between the optical lens and the substrate; the LED chip and the light transmitting glue layer are respectively accommodated in the light source cavity; the LED chip is arranged on top of the circuit and electrically connected with the circuit; the light transmitting glue layer is at least arranged on an upper surface of the LED chip; the light transmitting glue layer is used to reduce Fresnel loss when the light of the LED chip is taken out; an outer surface of the light transmitting glue layer is a convex surface, and the convex surface is used to reduce total reflection loss of light emitted by the LED chip.

In one embodiment, the light transmitting glue layer is arranged above the LED chip, the light transmitting glue layer on the LED chip is coated as one of the following: coating the upper surface of the LED chip; coating the upper surface and a side surface of the LED chip, and coating the upper surface and the side surface of the LED chip and connecting with the substrate.

In one embodiment, the semiconductor light source device of optical integrated packaging further comprises a wire, and the wire is partly coated with the light transmitting glue layer and electrically connected with the circuit and the LED chip respectively.

In one embodiment, a curvature of the convex surface is matched with a shape and a size of the LED chip, which is used to increase a total reflection angle of a light passing through the convex surface and reduce the total reflection loss.

In one embodiment, the light transmitting glue layer is formed by setting the light transmitting glue in a mold of a predetermined shape and being pressed with the substrate.

In one embodiment, the light transmitting glue layer is mixed with micro particles, and the micro particles include one or more of diffusion powder particles, fluorescent powder particles or colorant particles.

In one embodiment, at least one of inner and outer optical interfaces of the optical lens is a freeform surface.

In one embodiment, the light transmitting glue layer and the optical lens are made of silica gel or resin with a refractive index greater than 1.4.

In one embodiment, a part of a section on the side of the optical lens is parallel to a part of a section on the side of the substrate, and both are sections formed by dicing or laser cutting.

In one embodiment, a bottom of the optical lens with the light source cavity is sealedly connected with the substrate.

The semiconductor light source device of optical integrated packaging of the application is implemented by setting an outer surface of the light transmitting glue layer as a convex surface on the LED chip. When the light emitted from the LED chip passes through the light transmitting glue layer, since the refractive index of the light transmitting glue layer is greater than that of the air, the emitted light will be refracted at the outer surface of the light transmitting glue layer, making the light emitted from the LED chip deflected towards the top of the LED chip. The setting of the convex surface is helpful to increase the total reflection angle of the outgoing light, reduce the total reflection loss of the outgoing light, and improve the light extraction efficiency and efficiency of utilization of light. In addition, when the light extraction efficiency of the light source device increases, the amount of light that can be converted into heat energy in the optical lens decreases, thus reducing the heat output of the light source device, and the temperature rise of the light source device is small, thus delaying the aging rate of the light source device and prolonging its service life.

DETAILED DESCRIPTION OF THE PREFERRED EMBODIMENT

In order to make the above objects, features and advantages of the present application more obvious and easy to be understood, the specific embodiments of the present application will be described in detail below in conjunction with the accompanying drawings. In the following description, many specific details are set forth in order to make the present application be fully understood. But The present application can be implemented in many other ways different from those described herein, and those skilled in the art can make similar improvements without violating the connotation of the present application, so the present application is not limited by the specific embodiments disclosed below.

Figure 1:
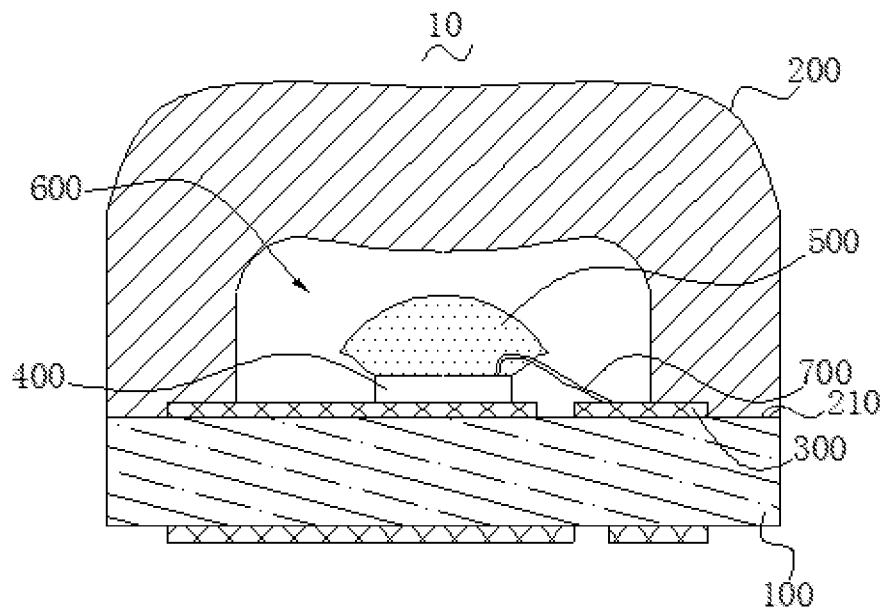
FIG. 1 is a sectional structure diagram of a semiconductor light source device of optical integrated packaging in an embodiment of the present application.
Figure 2:
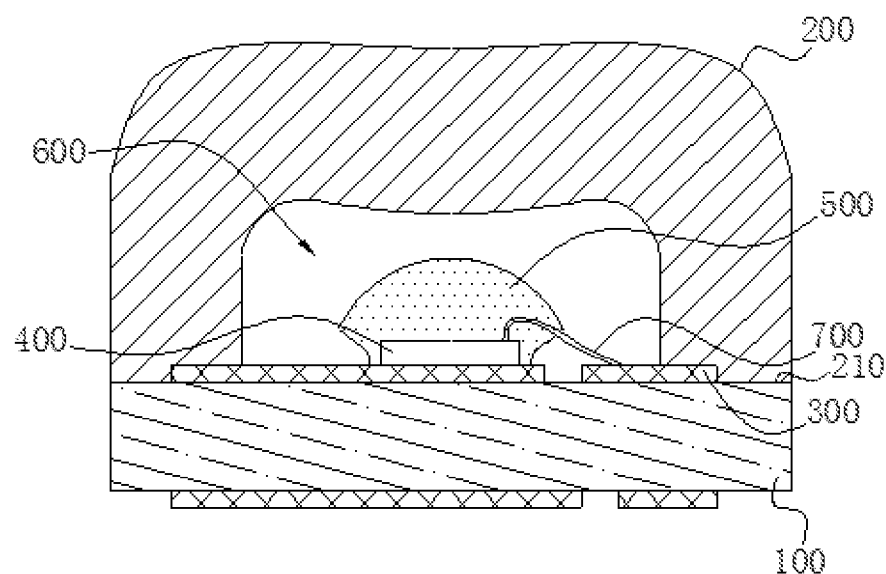
FIG. 2 is a sectional structure diagram of a semiconductor light source device of optical integrated packaging in another embodiment of the present application.

Referring to FIG. 1, the present application provides a semiconductor light source device of optical integrated packaging 10, comprising a substrate 100 with a circuit 300, an optical lens 200, a LED chip 400 and a light transmitting glue layer 500. The optical lens 200 is fixedly connected with the substrate 100; a light source cavity 600 is provided between the optical lens 200 and the substrate 100; the LED chip 400 and the light transmitting glue layer 500 are respectively accommodated in the light source cavity 600; the LED chip 400 is arranged on top of the circuit 300 and electrically connected with the circuit 300; the light transmitting glue layer is at least arranged on an upper surface of the LED chip 400; the light transmitting glue layer 500 is used to reduce Fresnel loss when the light of the LED chip 400 is taken out; an outer surface of the light transmitting glue layer 500 is a convex surface, and the convex surface is used to reduce a total reflection loss of a light emitted by the LED chip 400.

The semiconductor light source device of optical integrated packaging 10 of the application is implemented by setting an outer surface of the light transmitting glue layer 500 as a convex surface on the LED chip 400. When the light emitted from the LED chip 400 passes through the light transmitting glue layer 500, since the refractive index of the light transmitting glue layer 500 is greater than that of the air, the emitted light will be refracted at the outer surface of the light transmitting glue layer 500, making the light emitted from the LED chip 400 deflected towards the top of the LED chip 400. The setting of the convex surface is helpful to increase the total reflection angle of the outgoing light, reduce the total reflection loss of the outgoing light, and improve the light extraction efficiency and efficiency of utilization of light. In addition, when the light extraction efficiency of the light source device increases, the amount of light that can be converted into heat energy in the optical lens 200 decreases, thus reducing the heat output of the light source device, and the temperature rise of the light source device is small, thus delaying the aging rate of the light source device and prolonging its service life.

The substrate 100 is used for fixing and installing the optical lens 200, and forming the light source cavity 600 together with the optical lens 200, so as to facilitate the installation of the LED chip 400 and the light transmitting rubber layer 500, etc. The circuit 300 is set on the substrate 100 by printing. In actual production, the circuit 300 can also be set on the substrate 100 by electroplating or etching, and it is not described here. In addition, the substrate 100 is also used for connecting with an external environment element, for example, welding with the environmental element to achieve the installation setting of the light source device. It should be noted that in actual production, the substrate 100 can be made of either of the plastic material, the ceramic or metal material, and of course other materials. The selection is based on the production conditions and the applicable scene of the light source device, which will not be described here.

The optical lens 200 is used to refract the light emitted from the light transmitting glue layer 500 to adjust the size and shape of the light spot formed by the outgoing light, and further improve the quality of the light spot to meet the needs of users. Specifically, during the work of the LED chip 400, the light emitted by the LED chip 400 is incident from the inner surface of the optical lens 200, and then into the optical lens 200, and then emitted from the outer surface of the optical lens 200. The light is regulated through the interface of the inner surface and the outer surface of optical lens 200, which is more conducive to the control of the light type and can make the light spot more uniform in the effective area. It should be noted that in one embodiment, at least one of the two optical interfaces of the optical lens 200 is a freeform surface, that is, the inner surface and the outer surface of the top of the optical lens 200 can be curved surfaces at the same time, or one of them is a curved surface and the other is a plane; the curved surface can be either a concave arc or a convex arc; when the inner surface and the outer surface of the top of the optical lens 200 are curved surfaces at the same time, the concave and convex directions of the inner surface and the outer surface can be the same or different. In addition, according to the quality of the light spot expected by the user, multiple specifications of the optical lens 200 with different curved radii on the inner surface and the outer surface can be produced to meet the needs of the user, which will not be described here. In one embodiment, the optical lens 200 is made of silica gel or resin with a refractive index greater than 1.4. Silica gel and resin are materials that are easy to mold, which can reduce the process difficulty of the optical lens 200, and the light transmittance of the silica gel and resin is good, which is beneficial to reduce the loss of the light energy.

Furthermore, the bottom of the optical lens 200 is provided with a non-optical functional part 210, which is fixedly connected with the substrate 100. This part can't refract or adjust the light produced by the LED chip 400, but is only used to install the optical lens 200. While ensuring the stability of the connection between the optical lens 200 and the substrate 100, it prevents the substrate 100 from affecting the light output effect of the optical lens 200, so as to ensure the reliability of the light source device to improve the light extraction efficiency of the LED chip 400. Preferably, the bottom of the optical lens 200 with the light source cavity 600 is sealedly connected with the substrate 100, that is to say, the light source cavity 600 is relatively independent from the external environment and is not connected. In this way, the problem of light diffraction or scattering at the dust impurity caused by the dust impurity entering into the light source cavity 600 through the gap at the joint of the optical lens 200 and the substrate 100 is avoided, so as to improve the quality of the light spot. In addition, by sealing the bottom of the optical lens 200 with the substrate 100, the leakage damage of the LED chip 400 caused by the external water entering the light source cavity 600 is avoided, which is conducive to extending the service life of the light source device.

In one embodiment, a part of a section of the side of the optical lens 200 and a part of a section of the side of the substrate 100 are parallel to each other, and both are sections formed by dicing or laser cutting. Preferably, the part of the section of the side of the optical lens 200 is in the same plane as part of the section of the side of the substrate 100. In this way, when processing the light source device, it is only necessary to set the cutting distance of the cutter or the laser cutter, or it is not necessary to adjust the cutting distance when the optical lens 200 and the substrate 100 are cut, which avoids the problem of increasing workload caused by repeatedly adjusting the cutting angle of the cutter and the laser cutter, and is conducive to improving the processing efficiency of the light source device.

The circuit 300 is used for the electrical connection with the external power supply and controlling the LED chip 400 to emit light. In one embodiment, the semiconductor light source device of optical integrated packaging also includes a wire 700, which is partly coated with the light transmitting glue layer 500 and connected with the circuit 300 and the LED chip 400 respectively. That is, one end of the wire 700 is electrically connected with the circuit 300 and exposed to the light source cavity 600, and the other end of the wire 700 is covered by the light transmitting glue layer 500 and electrically connected with the LED chip 400. In this way, the connection part between the wire 700 and the LED chip 400 is fixed to avoid the disconnection of the connection between the wire 700 and the LED chip 400 when the light source device is vibrated by external force. In other words, the stability of the connection between the wire 700 and the LED chip 400 is improved.

The LED chip 400 is used to emit light when the power is on. Specifically, the LED chip 400 is a solid-state semiconductor device with P-N junction inside. When the current acts on the LED chip 400, electrons push from the N region of the P-N junction of the LED chip 400 to the P region, and compound with holes in the P region, and then emit energy in the form of photons, thus emitting light.

The light transmitting glue layer 500 is used to refract the light emitted by the LED chip 400, so as to reduce the Fresnel loss of the light emitted by the LED chip 400 and improve the light extraction efficiency of the LED chip 400. Specifically, due to the small refractive index of the air, when the light emitted by the LED chip 400 enters the light source cavity 600 without setting the light transmitting glue layer 500, the amount of light reflected at the interface between the LED chip 400 and the light source cavity 600 is large. In this way, the total amount of light energy emitted from the LED chip 400 to light source cavity 600 is reduced. In other words, the Fresnel loss of the light emitted by the LED chip 400 is large in the process of propagation, which makes the light extraction efficiency of the LED chip 400 low and affects the quality of the light spot emitted by the LED chip 400. When the light transmitting glue layer 500 is set, it is preferred that the light transmitting glue layer 500 is made of molded glass or silica gel or resin with a refractive index greater than 1.4. Due to the large refractive index of the above materials, the reflection amount of the light emitted by the LED chip 400 when passing through the light transmitting glue layer 500 is greatly reduced, and the Fresnel loss of the light emitted by the LED chip 400 in the process of propagation is reduced, thus improving the light extraction efficiency of the LED chip 400.

Furthermore, by setting the light transmitting glue layer 500, when the light emitted by the LED chip 400 is transmitted to the light transmitting glue layer 500, the size of the LED chip 400 and the size of the optical lens 200 can be appropriately reduced when the input power of LED chip 400 is determined. That is, to reduce the overall size of the light source device, the light type and the quality of the light spot emitted by the light source device can be guaranteed, so as to promote the development of light source devices to the direction of miniaturization.

In addition, by setting the outer surface of the light transmitting glue layer 500 as a convex surface, when the light emitted by the LED chip 400 is emitted through the convex surface, the total reflection angle of the outgoing light increases, which is conducive to reducing the total reflection loss of the outgoing light, and thus improving the light extraction efficiency. In one embodiment, the curvature of the convex surface is adapted to the shape and size of the LED chip 400, which is used to increase the total reflection angle of the light passing through the convex surface and reduce the total reflection loss. For example, the convex surface is a sphere, ellipsoid or freeform surface whose curvature is adapted to the shape and size of the LED chip 400. When the light emitted by the LED chip 400 propagates through the light transmitting glue layer 500, the light less than the boundary angle of the outer surface of the light transmitting glue layer 500 can be completely emitted, that is, total reflection occurs. By setting the outer surface of the light transmitting glue layer 500 as a convex surface with the curvature of which is matched with the shape and size of the LED chip 400, the boundary angle of the outer surface of the light transmitting glue layer 500, that is the total reflection angle, is greatly increased. In this way, more light is completely emitted from the outer surface of the light transmitting glue layer 500, thus, the total reflection loss of light emitted by LED chip 400 is further reduced, and the light extraction efficiency of the LED chip 400 is improved. It should be noted that the curvature of the convex surface disclosed in this embodiment is adapted to the shape and size of the LED chip 400, which means that the shape of the convex surface is designed according to the shape and size of the LED chip 400 and the light propagation theory, so that the total reflection angle of the light emitted from each part of the LED chip 400 through the corresponding part of the convex surface reaches the maximum, so as the total reflection loss of the emitted light is reduced to the greatest extent, and the purpose of improving the light extraction efficiency is achieved. The embodiment only shows that the light transmitting glue layer 500 is shaped in a spherical, ellipsoid or freeform surface. In actual production, according to the shape and size of the LED chip 400, as well as the production process conditions and production capacity, the outer surface of the light transmitting glue layer 500 can also be convex ellipsoid or other arc surface of other shapes, so it is not to be described here.

In an embodiment, the light transmitting glue layer 500 is arranged above the LED chip 400, and the light transmitting glue layer 500 on the LED chip 400 is coated as one of the following: coating the upper surface of the LED chip 400; coating the upper surface and a side surface of the LED chip 400, and coating the upper surface and the side surface of the LED chip 400 and connecting with the substrate 100. The above three kinds of coating methods can be achieved by setting the light transmitting glue in a mold of a predetermined shape and being pressed with the substrate 100 under the condition of adjusting the amount of adhesive. Specifically, the light transmitting glue is loaded into a mold with a predetermined shape, and then the substrate 100 with the LED chip 400 is overturned and pressed on the mold to make the LED chip 400 contact the light transmitting glue in the mold until the light transmitting glue is consolidated on the top of the LED chip 400, that is, the light transmitting glue layer 500 is connected with the LED chip 400.

In another embodiment, the light transmitting glue can also be drip-coated on the upper surface of the LED chip 400, that is, the top of the LED chip 400, and the light transmitting glue layer 500 can be formed when the light transmitting glue is consolidated. In this case, the light transmitting glue layer 500 is firmly combined with the top of the LED chip 400, so as to refract the light emitted from the LED chip 400. In the process of drip-coating of the light transmitting glue, the light transmitting glue is naturally formed into light transmitting glue layer 500 under the action of gravity and surface tension, which reduces the processing difficulty of light source devices and is conducive to large-scale production of products. In addition, the side of the light transmitting glue layer 500 formed by the natural forming of the light transmitting glue can refract the light emitted by the LED chip 400, so that this part of the light deflects towards the top of the LED chip 400, thus reducing the side light emitting angle of the LED chip 400, and further reducing the difficulty of the light-receiving design of the optical lens 200.

It should be noted that when the light transmitting glue layer 500 covers the upper surface and side surface of the LED chip 400 and is connected with the substrate 100, the light transmitting glue layer 500 is connected with the LED chip 400 and the substrate 100 at the same time on the premise that the light transmitting glue layer 500 refracts the light emitted by the LED chip 400, which increases the installation area of the light transmitting glue layer 500 and prevents the light transmitting glue layer 500 from falling off from the LED chip 400, and ensures the reliability of the light source device of the embodiment in improving the light extraction efficiency of the LED chip 400.

In one embodiment, the light transmitting glue layer 500 is mixed with micro particles, which include one or more of diffusion powder particles, fluorescent powder particles or colorant particles. Specifically, in the processing process of the light transmitting glue layer 500, the micro particles are added to the light transmitting glue and fully stirred to make the micro particles uniformly disperse in the light transmitting glue, so as to obtain the light transmitting glue layer 500 in which the micro particles are uniformly dispersed. Diffusion powder particle is a kind of dispersant with excellent performance, which has a good light uniformity effect. It can homogenize the light emitted by the LED chip 400, so as to weaken the influence of the electrode pattern imaging in the LED chip 400 on the outgoing light, and improve the quality of the light spot. The fluorescent powder particles can homogenize the light emitted by the LED chip 400, and can also convert the light emitted by the LED chip 400 into white light, that is, improve the brightness of the light emitted by the LED chip 400. The colorant particles have light shielding property, which can shield the light in a specific wavelength range, so that the light emitted through the optical lens 200 presents a specific color, so as to achieve the purpose of controlling the light color.

The technical features of the above-mentioned embodiments can be arbitrarily combined. In order to make the description concise, all possible combinations of the technical features in the above-mentioned embodiments are not described. However, as long as there is no contradiction in the combination of these technical features, it should be considered as the scope of the description.

The above-mentioned examples only express several embodiments of the application, and the description is more specific and detailed, but it can not be understood as a limitation on the scope of the application. It should be pointed out that for ordinary technicians in the art, a number of modifications and improvements can be made without departing from the concept of the application, which belong to the protection scope of the application. Therefore, the scope of protection of the application patent shall be subject to the attached claims.

The invention claimed is:

1. A semiconductor light source device of optical integrated packaging (10), wherein, comprises a substrate (100), an optical lens (200), a LED chip (400) and a light transmitting glue layer (500), and a wire (700), the substrate (100) is provided with a circuit (300), the optical lens (200) is fixed upon the substrate (100), an outer bottom part of the optical lens (200) having an outer surface contacts and is above and sealedly connected with the substrate (100), a part of a section of a side of the optical lens (200) and a part of a section of a side of the substrate (100) are formed by dicing or laser cutting and in a same plane, the LED chip (400) is electrically connected with a first portion of the circuit (300), the wire (700) is partly coated with the light transmitting glue layer (500) and electrically connected with a second portion of the circuit (300) and the LED chip (400) respectively, and an inner bottom part of the optical lens (200) having an inner surface is above and fixed with the first and second portions of the circuit (300) respectively; a light source cavity (600) is provided between the optical lens (200) and the substrate (100); the LED chip (400) and the light transmitting glue layer (500) are respectively accommodated in the light source cavity (600); the LED chip (400) is arranged on top of the circuit (300) and electrically connected with the circuit (300); a side surface of the LED chip (400) is exposed in the light source cavity (600); the light transmitting glue layer is arranged on an upper surface of the LED chip (400) and not on the side surface of the LED chip (400); the light transmitting glue layer (500) is used to reduce Fresnel loss when light of the LED chip (400) is taken out; an outer surface of the light transmitting glue layer (500) is a convex surface which is used to reduce total reflection loss of the light emitted by the LED chip (400); a curvature of the convex surface is matched with a shape and a size of the LED chip (400), which is used to reduce the total reflection loss by increasing a total reflection angle; a lower side of the light transmitting glue layer (500) is configured to deflect by refraction part of the light emitted by the LED chip (400) towards a top of the LED chip (400) for reducing a side light emission angle of the LED chip (400), and the wire (700) is arranged to pass through the lower side of the light transmitting glue layer (500).

2. The semiconductor light source device of optical integrated packaging (10) according to claim 1, wherein, the light transmitting glue layer (500) includes light transmitting glue.

3. The semiconductor light source device of optical integrated packaging (10) according to claim 1, wherein, the light transmitting glue layer (500) is mixed with micro particles which include one or more types of diffusion powder particles, fluorescent powder particles, and colorant particles.

4. The semiconductor light source device of optical integrated packaging (10) according to claim 1, wherein, at least one of inner and outer optical interfaces of the optical lens (200) is a freeform surface.

5. The semiconductor light source device of optical integrated packaging (10) according to claim 1, wherein, the light transmitting glue layer (500) and the optical lens (200) are made of silica gel or resin with a refractive index greater than 1.4.

* * * * *